United States Patent [19]

Nishiura et al.

[11] Patent Number: 4,987,098

[45] Date of Patent: Jan. 22, 1991

[54] METHOD OF PRODUCING A METAL-OXIDE SEMICONDUCTOR DEVICE

[75] Inventors: Masaharu Nishiura, Nagano; Kenya Sakurai, Matsumoto, both of Japan

[73] Assignee: Fuji Electric Co., Ltd., Kawasaki, Japan

[21] Appl. No.: 392,047

[22] Filed: Aug. 10, 1989

[30] Foreign Application Priority Data

Aug. 10, 1988 [JP] Japan .................. 63-199494

[51] Int. Cl.$^5$ .......................................... H01L 21/336
[52] U.S. Cl. ................................... 437/142; 437/154; 437/29; 437/40; 437/45; 148/DIG. 126; 148/DIG. 18; 148/DIG. 167
[58] Field of Search ............ 437/142, 29, 45, 44, 437/40, 41, 154; 357/23.4, 23.3; 148/DIG. 126, DIG. 18, DIG. 167

[56] References Cited

U.S. PATENT DOCUMENTS

| | | | |
|---|---|---|---|
| 3,640,783 | 2/1972 | Bailey | 437/142 |
| 4,370,180 | 1/1983 | Azuma et al. | 437/142 |
| 4,454,527 | 6/1984 | Patalong | 357/23.4 |
| 4,593,302 | 6/1986 | Lidow et al. | 357/23.4 |
| 4,662,957 | 5/1987 | Hagino | 437/142 |
| 4,717,940 | 1/1988 | Shinohe et al. | 357/23.4 |
| 4,777,149 | 10/1988 | Tanabe et al. | 437/142 |
| 4,794,432 | 12/1988 | Yilmaz et al. | 357/23.4 |
| 4,803,532 | 2/1989 | Mihara | 357/23.4 |
| 4,914,047 | 4/1990 | Seki | 437/29 |

FOREIGN PATENT DOCUMENTS

| | | | |
|---|---|---|---|
| 0153469 | 9/1982 | Japan | 357/23.4 |
| 0200544 | 11/1983 | Japan | 437/142 |
| 0072732 | 4/1984 | Japan | 437/142 |
| 0292327 | 12/1986 | Japan | 437/142 |
| 0127571 | 5/1988 | Japan | 357/23.4 |
| 82/02981 | 9/1982 | World Int. Prop. O. | 357/23.4 |

Primary Examiner—Brian E. Hearn
Assistant Examiner—T. N. Quach
Attorney, Agent, or Firm—Brumbaugh, Graves, Donohue & Raymond

[57] ABSTRACT

The present invention relates to a method of producing a metal-oxide semiconductor device with improved capacity for preventing an actuation of a parasitic bipolar transistor. In the present invention, a metal-oxide semiconductor device is produced through a process in which a single conductive semiconductor region with low-impurity density, on top of which region a gate electrode is provided via a gate-insulating film, consists of two sub-layers with different specific resistance. The upper sub-layer of the region has a significantly lower specific resistance than the lower sub-layer of the region. When a lifetime-reducing agent for reducing the reverse-recovery time of a built-in diode is diffused into the single conductive semiconductor region with low-impurity density, the lifetime-reducing agent concentrates in the upper sub-layer of the region, thereby increasing the specific resistance of the upper sub-layer. Because the specific resistance of the upper sub-layer is initially low, however, the increase in the specific resistance is compensated, and the on-resistance at the time of conduction of the metal-oxide semiconductor device does not increase as a whole. Consequently, the reverse-recovery time of the built-in diode is reduced without an overall increase in the on-resistance, thereby preventing an actuation of the parasitic bipolar transistor without additional power loss.

3 Claims, 3 Drawing Sheets

METHOD OF PRODUCING A METAL-OXIDE SEMICONDUCTOR DEVICE

BACKGROUND OF THE INVENTION

The present invention relates to a manufacturing method for a metal-oxide semiconductor device, wherein an actuation of a parasite bipolar transistor is prevented without any increase of on-resistance or sacrifice of turn-off capacity.

The metal-oxide semiconductor devices include power MOSFETs, which utilize only one type of charge carriers, and insulated gate bipolar transistors ("IGBT") (also called "IGT" or "COMFET"), which utilize both electrons and holes as charge carriers.

FIG. 2 is a sectional view showing the structure of a prior art power MOSFET having an n-type channel element. The formation of such a device is described in U.S. patent application Ser. No. 07/316,474 filed on Feb. 27, 1989 now U.S. Pat. No. 4,914,047 and incorporated herein by reference. The initial step in the manufacture of such a power MOSFET is epitaxially forming an n⁻ layer 1 on a semiconductor substrate functioning as a drain, namely the n+ layer 2. Next, a p+ layer 3 is formed by diffusion, which is embedded in the n⁻ layer 1. A gate insulating film 41 is next formed, followed by forming of a gate electrode 5 over the gate insulating film 41. Subsequently, the gate electrode 5 is windowed through photolithography. Then, a p-type base layer 6 is formed by diffusion, with the windowed gate electrode 5 functioning as a mask. Next, a p+ low-resistance layer 7 is similarly formed in the p-layer 6 through photolithography and diffusion. An n+ layer 8, functioning as a source, is then formed with the gate electrode 5 again working as a part of a mask. The top surface, of which the gate electrode 5 forms a portion, is coated with an insulating film 42 and windowed to facilitate connection between the source layer 8 and a source electrode 11, which is next formed. Finally, a drain electrode 12 is formed to contact the n+ layer 2.

In the prior art power MOSFET, when a positive voltage is applied to the gate electrode 5, relative to the source electrode 11, an n-channel 9 is formed on the surface of the p-type base layer 6, directly under the gate insulating film 41. In this condition, electrons are injected from the source layer 8 to the drain layer, which consists of the high-resistance layer 1 and the lower resistance layer 2, via an induced n-channel 9. Consequently, the gate electrode 5 is kept at equipotential to the source electrode. If a negative voltage is subsequently applied to the gate electrode 5, relative to the source electrode 11, or negative-biased, no conducting channel exists between the source layer and the drain layer. By changing the biasing between the source layer and the drain layer, as described above, the prior art power MOSFET can be used as a switching element.

FIG. 3 represents a prior art IGBT, which can be produced through a process similar to the process for manufacturing power MOSFETs. Such a process is described in U.S. patent application Ser. No. 07/316,462 filed Feb. 27, 1989 and incorporated herein by reference. Since the drain layer 10 of the IGBT is a p+ type material, holes are injected from the p+ drain layer 10 to the n⁻ layer 1 via the n+-buffer layer 2, simultaneously with the injection of electrons from the source layer 8 to the p+ layer 10 via the n⁻ layer and the n+ buffer layer 2. Consequently, the n⁻ layer 1 causes a conductivity modulation, thereby reducing its resistance.

When a prior art MOSFET shown in FIG. 5 is turned off while connected to an inductive load, a depletion layer 22 quickly forms on both sides of a p-n junction 21. When the depletion layer is formed, a hole-drift current 23 is generated, which current flows from the depletion region to the p+ low-resistance layer 7, via the p base layer 6 under the n+ source layer 8. Since the source electrode 11 electrically connects the surface of the p layer 6 and the n+ source layer 8, a potential difference between the two layers is produced as a result of the hole current 23 and a base resistance $R_b$. When the potential difference exceeds a built-in voltage between the base layer 6 and the source layer 8, electrons are injected from the source layer 8 to the n⁻ layer 1, thereby actuating an NPN parasitic transistor consisting of the n⁻ source layer 8, the p base layer 6, and n⁻ layer 1. As a result, current flows through the parasitic transistor, resulting in a breakdown of the transistor element.

It is well-known that the p+ diffusion layer 3 of FIG. 2 is formed to minimize the hole current 23 shown in FIG. 5, thereby preventing the breakdown of the element. Similarly, the p+ low resistance layer 7 is formed to prevent the breakdown of the element. The p+ layer 7 minimizes the base resistance $R_b$, thereby preventing the parasitic transistor from turning on. Despite the above-described structural elements, unwanted actuation of the parasitic transistor, in a power MOSFET connected to an inductive load, is not adequately curtailed.

In the case of an IGBT shown in FIG. 3, the IGBT connected to an inductive load may breakdown, when turned off, due to the actuation of the parasitic transistor consisting of the n+ source layer 8, the p base layer 6, and the n⁻ layer 1. Furthermore, the hole current 23 shown in FIG. 5 flows in the IGBT even in a normal on-state. Consequently, the actuation of the parasitic transistor may occur in the IGBT even when it is in the normal on-state, or when the IGBT is not connected to an inductive load at the time of turn-off. As in the prior art power MOSFET, the p+ diffusion layer 3 and the p+ low resistance layer 7 are formed in the prior art IGBT to prevent the actuation of the parasitic transistor. Once again, the actuation of the parasitic transistor is not adequately curtailed.

The problems of the prior art are further explained in conjunction with FIG. 4, which represents an inverter circuit for driving a motor 55. The inverter circuit consists of four MOSFETs 51 to 54 of the type of MOSFET shown in FIG. 2. Diodes 31 to 34, each of which is formed of a p region and an n⁻ layer, are incorporated in the MOSFET's 51 to 54, respectively. The above-mentioned p region consists of the p+ layer 3, the p layer 6, and the p+ layer 7, all as shown in FIG. 2. The n⁻ layer of the diode is the layer 1 in FIG. 2.

From an initial state, in which the motor 55 is driven with the MOSFET's 52 and 53 on, the MOSFET 52 is subsequently turned off, and a load current is commutated to the diode 31 of the MOSFET 51. Next, when the MOSFET 52 is turned on, a reverse-recovery current of the diode 31 flows in addition to the load current. During the reverse-recovery time of the diode 31, a parasitic bipolar transistor of the MOSFET 52, which consists of the n+ source layer 8, the p base layer 6, and the n⁻ layer 1, is turned on. Consequently, a breakdown of the MOSFET occurs. The parasitic bipolar transistor is turned on due to a large reverse-recovery current of the diode 31, which results in a sudden rise of the voltage into the avalanche region, and also due to a current generated by a high dv/dt.

Several plausible methods of preventing an actuation of the parasitic bipolar transistor exist. One method is to prevent the commutation current from flowing to the built-in diode by incorporating an external free-wheeling diode and a Schottky barrier diode. Another method is to reduce the di/dt and the dv/dt by increasing an external gate resistance. Yet another method to enhance the breakdown capacity by reducing the reverse-recovery current and the reverse-recovery time of the built-in diode.

The first two of the above-described methods involve increased number of components and, hence, increased cost. The last method is also problematic. If a lifetime-reducing agent, platinum for example, is introduced to reduce the reverse recovery time, an on-resistance increases. Consequently, power loss is increased, which is not desirable.

Accordingly, it is an object of the present invention to eliminate the above-described problems in the prior art. This object is attained by providing a manufacturing method for a metal-oxide semiconductor device in which the reverse-recovery time of a built-in diode is reduced, without an increase in the on-resistance, to prevent an actuation of the parasitic bipolar transistor, while maintaining a powerful turn-off capacity.

SUMMARY OF THE INVENTION

To overcome the problems noted above, a metal-oxide semiconductor device is formed in accordance with the invention, in which device the epitaxial layer of high resistance formed on the substrate layer is made up of two sublayers, a first semiconductor sub-layer with high resistance and a second semiconductor sub-layer of the same conductivity type, but with a lower resistance preferably about one half the resistance of the first sub-layer. The two layers form a single region of low-impurity density disposed on top of a semiconductor substrate of the first conductivity type with high-impurity density, and the single region of low-impurity density forms a first surface of a transistor element.

BRIEF DESCRIPTION OF THE DRAWINGS

For convenience and clarity, like components, elements and features in the various figures are designated by the same reference numbers.

DETAILED DESCRIPTION OF THE INVENTION

Figure 1A:
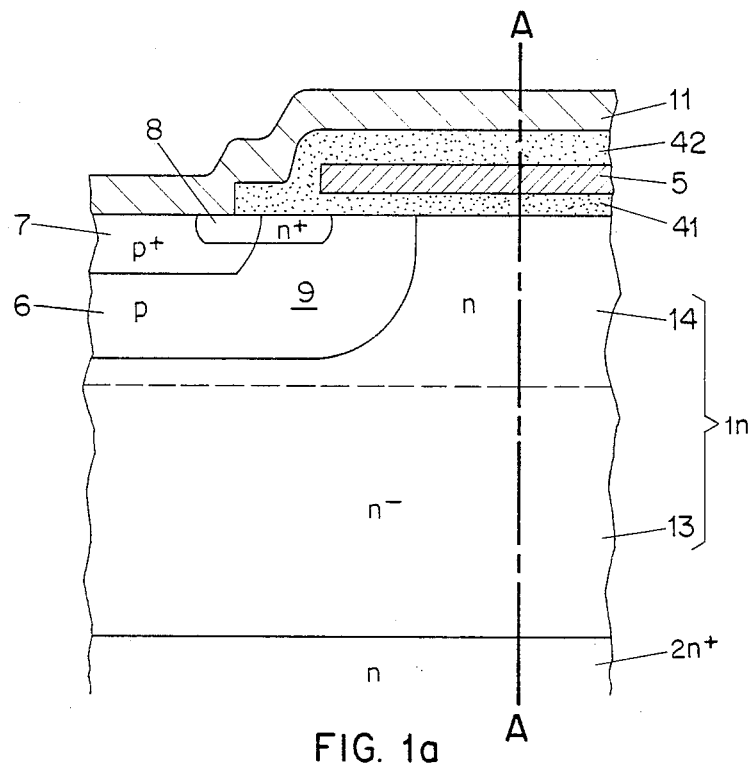
FIG. 1(a) shows a cross-sectional view of a representative embodiment of a MOSFET manufactured according to the invention.

As described above, a prior art power MOSFET or an IGBT incorporates a single conductive semiconductor region of low-impurity density and uniform specific resistance, which layer is disposed on a semiconductor substrate layer of another type. In these prior art devices, an unwanted actuation of a parasitic bipolar transistor is not adequately prevented. In the present invention, however, the single conductive semiconductor region with low-impurity density does not have a uniform specific resistance, but rather consists of two sub-layers with different specific resistances. The term sub-layer as used herein refers to discrete layers or a graduated structure of varying resistance which approximates two layers, 14 and 13, as shown in FIG. 1(a). The specific resistance of the upper layer of the single conductive semiconductor region is lower, relative to the lower layer. When a lifetime-reducing agent, for example platinum, for reducing the reverse-recovery time of a built-in diode is diffused into the single conductive semiconductor region with low-impurity density, the specific resistance of the upper layer increases as a result of concentration of the lifetime-reducing agent. However, the increase in specific resistance is compensated by the initially-low specific resistance of the upper layer. Consequently, the on-resistance at the time of conduction of the metal-oxide semiconductor device is maintained at a stable level, while the reverse-recovery time of the built-in diode is reduced, thereby preventing an actuation of the parasitic bipolar transistor without additional power loss.

The present invention will be further explained with reference to the formation of a nonlimiting embodiment In this embodiment, a process for producing a power MOSFET will be described.

Initially, a single conductive semiconductor region 1 with low-impurity density, which consists of an n sub-layer 14 disposed on top of n⁻ sub-layer 13, is epitaxially formed on a semiconductor substrate functioning as an n⁺ drain layer 2. Subsequently, a lifetime-reducing agent for reducing the reverse-recovery time of a built-in diode is diffused into the epitaxial region 1. Next, a gate-insulating film 41 is formed, followed by the formation of a layer for a gate electrode 5, over the gate-insulating film 41. The layer is windowed to form the gate electrode 5 through photolithography.

The windowed gate electrode 5 functions as a mask in forming a p-type base layer 6, which is formed by diffusion. Next, a p⁺ low-resistance layer 7 is similarly formed in the p layer 6 through photolithography and diffusion. An n⁺ layer 8, functioning as a source, is next formed with the gate electrode 5 again working as a part of a mask.

The top surface, of which the gate electrode forms a portion, is coated with an insulating film 42 and windowed to facilitate connection between the source layer 8 and a source electrode 11, which is formed next as the top surface. Finally, a drain electrode 12 is formed to contact the n⁺ layer 2, thereby forming the bottom surface of the MOSFET.

A process for producing an IGBT is similar to the above-described process. An IGBT is distinguished from a MOSFET by having on the drain side a region of an opposite conductivity type to that of the source region. Therefore, the process for producing an IGBT incorporates an additional step of forming a p+ layer below the n+ layer 2 after the diffusion of the lifetime-reducing agent.

FIG. 1(a) shows a representative embodiment of a MOSFET constructed in accordance with the invention. A high-resistance sub-layer 13, a thickness of which may be 30 to 80 μm, is epitaxially formed on an Sb-doped Si substrate 2. The surface sub-layer 14, a thickness of which may be 10 to 20 μm, is formed in such manner as to reduce its specific resistance relative to the specific resistance of the layer 13.

Figure 1B:
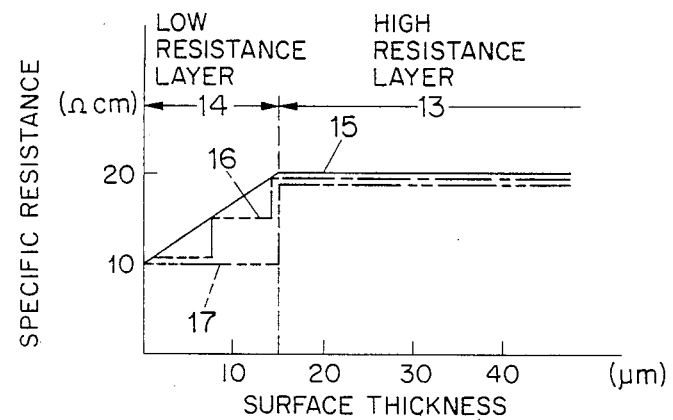
FIG. 1(b) shows specific resistances of an epitaxial layer 1 as a function of depth along the line A—A of FIG. 1(a)
Figure 2:
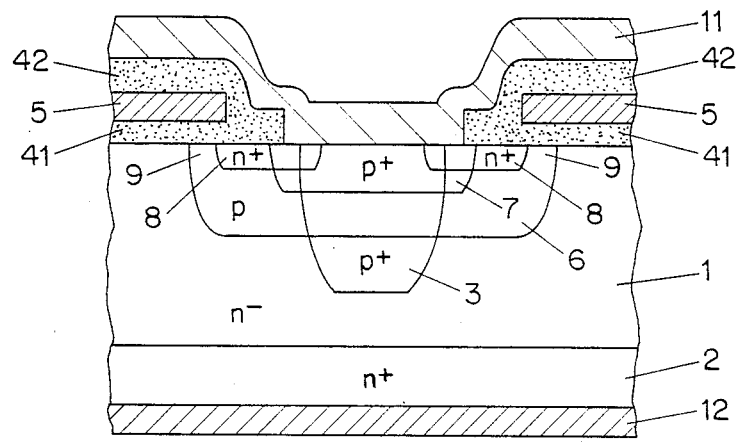
FIG. 2 shows a cross sectional view of a power MOSFET manufactured according to the prior art method.
Figure 3:
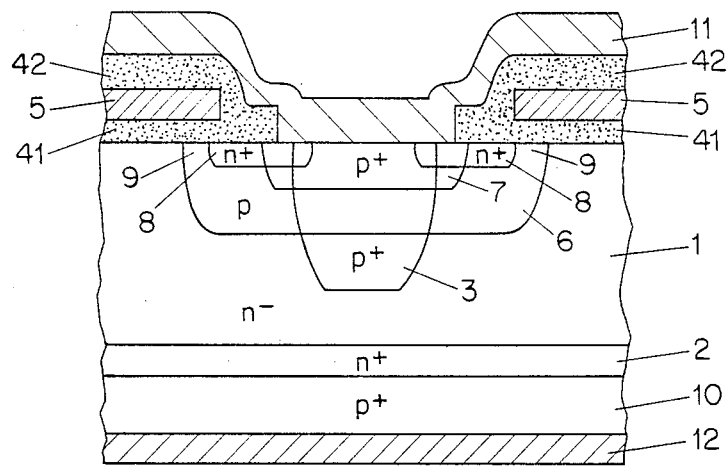
FIG. 3 shows a cross-sectional view of an IGBT manufactured according to the prior art method.
Figure 4:
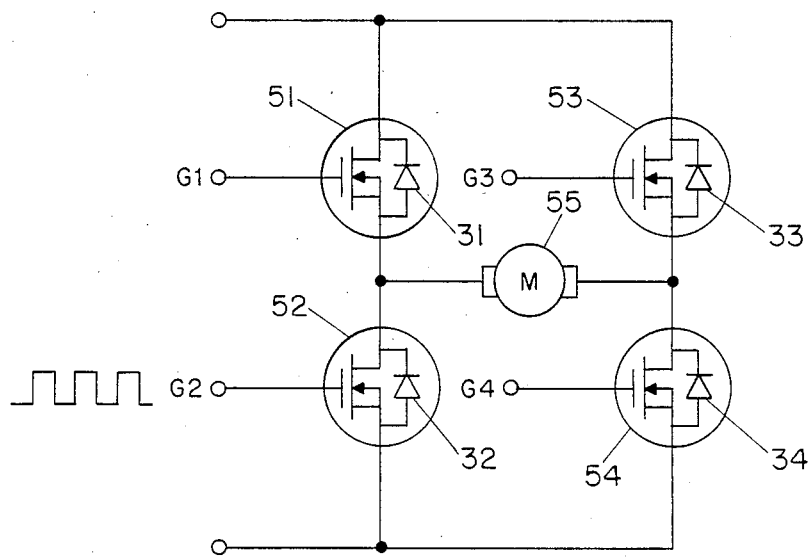
FIG. 4 represents an inverter circuit for driving a motor, which circuit uses four MOSFET's of FIG. 2.
Figure 5:
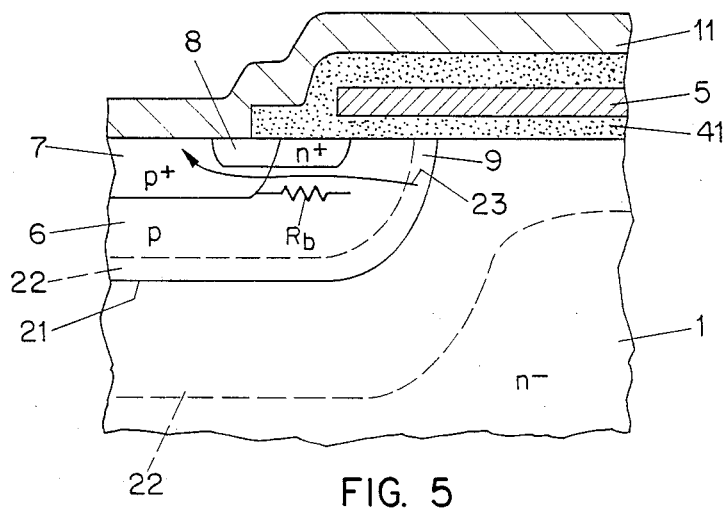
FIG. 5 shows a cross-sectional view of a prior art MOSFET, which view is used in conjunction with explaining a breakdown caused by operating a MOSFET on an inductive load.

FIG. 1(b) shows the specific resistances of an epitaxial layer 1 as a function of depth along the line A—A of FIG. 1(a). In an example shown by a solid line 15 in FIG. 1(b), P was used as a doping agent to grow an n⁻-type sub-layer 13 with a specific resistance of 20 Ωcm and a thickness of 30 to 80 μm. The n-type epitaxial sub-layer 14, with a thickness of 15 μm and a linearly varying specific resistance, was formed by successively varying the ratio of $PH_3$ and $SiH_4$ such that the specific resistance of the surface was adjusted to 10 Ωcm. In an example indicated by a one-dotted line 16 in FIG. 1(b), the sub-layer 14, once again 15 μm thick, consists of two regions with different specific resistances. The lower 7.5 μm portion of the sub-layer 14 has a specific resistance of 15 Ωcm, and the upper 7.5 μm portion has a specific resistance of 10 Ωcm. Finally, in an example shown by a two-dotted line 17 in FIG. 1(b), the entire sub-layer 14 of 15 μm thickness has a specific resistance of 10 Ωcm.

Figure 6:
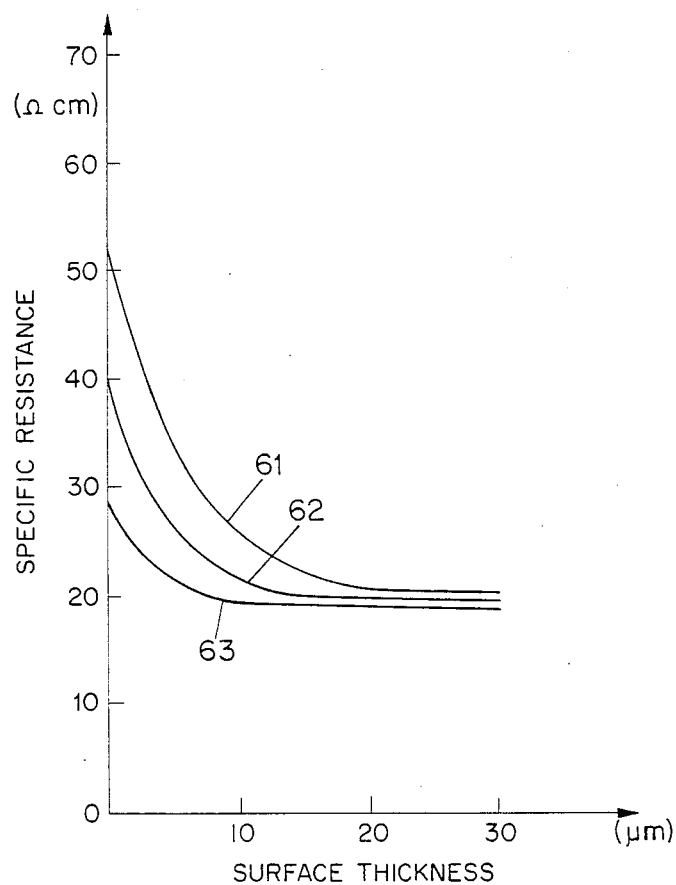
FIG. 6 shows specific resistance distributions of an epitaxial layer 1 as a function of depth and diffusion temperature, which distribution is the result of a change in Pt concentration in layer 1 along the line A—A of FIG. 1(a)

FIG. 6 shows specific-resistance distributions of an epitaxial layer 1 as a function of depth and diffusion temperature. These distributions are the result of a change in Pt concentration in the layer 1 along the line A—A of FIG. 1(a). Pt is diffused in the epitaxial layer 1 as a lifetime-reducing agent for reducing the reverse recovery time of a built-in diode.

As a diffusion source, a silica solution containing a platinum compound (OCD Type 1 from Tokyo Oka K.K.) was applied to the bottom surface of the substrate layer 2. The solution was diffused on a diffuser for 30 minutes in oxygen and 90 minutes in nitrogen. The lines 61, 62 and 63 indicate a diffusion temperature of 880° C., 860° C., and 840° C., respectively. As evident from FIG. 6, the specific resistances increase due to a high concentration of Pt near the surface of the epitaxial layer 1, i.e., the low-resistance sub-layer 14. As previously mentioned the increase in resistance due to a high concentration of a lifetime-reducing agent is compensated by the low-resistance sub-layer 14. Pt may be substituted by other agents as a lifetime-reducing agent, such as Au.

Figure 7:
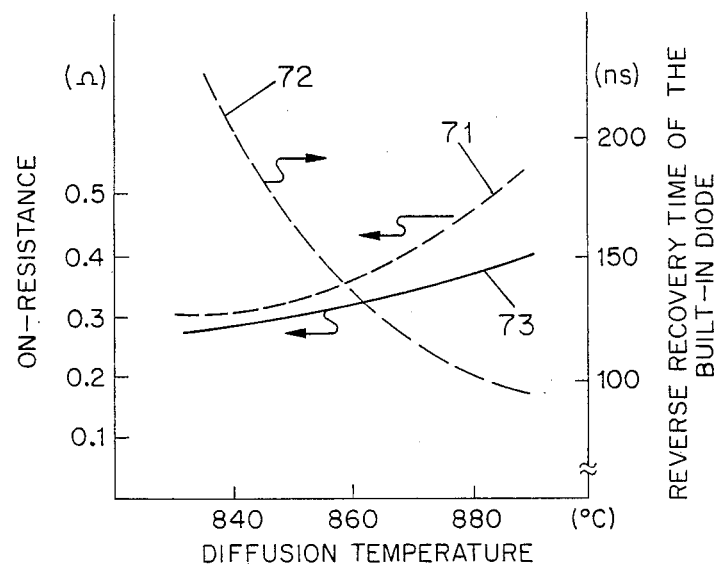
FIG. 7 represents relationships among an on-resistance of a MOSFET, the reverse-recovery time of a built-in diode, and a diffusion temperature.

FIG. 7 represents relationships among an on-resistance $R_{on}$ of a MOSFET when a gate volta $V_{gs}$ is 15 V, the reverse-recovery time $t_{rr}$ of a built-in diode, and a diffusion temperature. Broken lines 71 and 72 indicate the $R_{on}$ and the $t_{rr}$, respectively, when the epitaxial layer 1 is formed to have a uniform specific resistance of 20 Ωcm. When the diffusion temperature is kept at 880° C. to minimize the $t_{rr}$, the $R_{on}$ is 0.5 Ω. If, however, the upper portion of the epitaxial layer 1, the sub-layer 14, is formed to have a lower specific resistance than the sub-layer 13, the $R_{on}$ decreases as shown by a solid line 73. Note that the $t_{rr}$ does not change significantly from the line 72 when the specific resistance of the sub-layer 14 is lowered.

As described above, in a prior art IGBT or a power MOSFET, a single conductive semiconductor region with low-impurity density, namely an n⁻ layer, is epitaxially formed on top of an n+ layer. In the present invention, however, the single conductive semiconductor region with low-impurity density consists of a low resistance n layer disposed on top of a high resistance n⁻ layer, which region with low-impurity density is epitaxially formed on top of the n+ layer. When a lifetime-reducing agent is introduced to reduce the reverse-recovery time of a built-in diode, thereby preventing an actuation of the parasitic bipolar transistor, the lifetime-reducing agent concentrates predominantly in the low resistance n layer, thereby increasing the resistance of this layer. Since the resistance of the n layer is initially low, however, the increase in resistance caused by the lifetime-reducing agent is compensated, and the on-resistance is prevented from increasing as a whole.

We claim:

1. In a method for producing a metal-oxide semiconductor device comprising a semiconductor substrate of a first conductivity type with high-impurity density, which substrate functions as a drain layer, a transistor element disposed on a surface of the substrate, which transistor element comprises a low-impurity density region of the first conductivity type having a lifetime-reducing agent diffused therein, a base region of a second conductivity type embedded within the low-impurity density region of the first conductivity type and extending to a first surface of the transistor element, a high-impurity density region of the second conductivity type embedded within the base region and extending to the first surface of the transistor element, and a source region of the first conductivity type with high-impurity density embedded at the interface between the base region and the high-impurity density region of the second conductivity type, which source region extends to the first surface of the transistor element, whereby the first surface of the transistor element has the high-impurity density region, which is surrounded by the source region, which source region is in turn surrounded by the base region, which region is surrounded by the low-resistance layer, and a second surface of the transistor element, which surface is disposed toward the substrate, is the high-resistance material, and a gate electrode disposed over a gate-insulating film, which is in turn disposed over all of the base region and the low-resistance material portion of the first surface of the transistor element but not over the high-impurity density region of the second conductivity type, the improvement comprising of forming the low-impurity density region of the first conductivity type as two sub-layers, a first sub-layer disposed proximately to the substrate having high resistance and a second sub-layer with a resistance about one half the resistance of the first sub-layer, the two sub-layers together forming a single region of low-impurity density prior to diffusion of the lifetime-reducing agent.

2. A method according to claim 1, wherein the metal-oxide semiconductor device is a power metal-oxide semiconductor field effect transistor.

3. A method according to claim 1, wherein the metal-oxide semiconductor device is an insulated gate bipolar transistor.

* * * * *